(12) United States Patent
Sakamoto et al.

(10) Patent No.: US 7,947,568 B2
(45) Date of Patent: May 24, 2011

(54) METHOD OF MANUFACTURING SEMICONDUCTOR DEVICE

(75) Inventors: Keiji Sakamoto, Kanagawa (JP);
Takashi Ogura, Kanagawa (JP);
Masashige Moritoki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/548,471

(22) Filed: Aug. 27, 2009

(65) Prior Publication Data
US 2010/0167493 A1 Jul. 1, 2010

(30) Foreign Application Priority Data
Dec. 25, 2008 (JP) ................................ 2008-330035

(51) Int. Cl.
*H01L 21/76* (2006.01)
(52) U.S. Cl. . 438/424; 438/425; 438/435; 257/E21.545; 257/E21.546

(58) Field of Classification Search .................. 438/424, 438/425, 435; 257/E21.545, E21.546
See application file for complete search history.

(56) References Cited

U.S. PATENT DOCUMENTS

| | | | |
|---|---|---|---|
| 6,271,143 B1 | 8/2001 | Mendicino | |
| 6,368,941 B1 * | 4/2002 | Chen et al. | 438/424 |
| 6,495,424 B2 * | 12/2002 | Kunikiyo | 438/296 |
| 7,148,155 B1 * | 12/2006 | Tarafdar et al. | 438/778 |
| 2007/0020877 A1 * | 1/2007 | Tseng et al. | 438/424 |

FOREIGN PATENT DOCUMENTS

| | | |
|---|---|---|
| JP | 08-288382 | 11/1996 |
| JP | 2004-207280 | 7/2004 |

* cited by examiner

*Primary Examiner* — Alexander G Ghyka
*Assistant Examiner* — Seahvosh J Nikmanesh
(74) *Attorney, Agent, or Firm* — Young & Thompson

(57) ABSTRACT

A method of manufacturing a semiconductor device includes a process of forming a STI trench in a substrate, a process of forming a thermal oxide film on a sidewall and a bottom surface of the STI trench, a process of performing a plasma treatment on a surface of the thermal oxide film that is located at a bottom portion of the STI trench, and a process of forming an insulating film in the STI trench using a CVD method.

13 Claims, 3 Drawing Sheets

METHOD OF MANUFACTURING SEMICONDUCTOR DEVICE

This application is based on Japanese patent application NO. 2008-330035, the content of which is incorporated hereinto by reference.

BACKGROUND

1. Technical Field

The present invention relates to a method of manufacturing a semiconductor device.

2. Related Art

In recent years, a size of a semiconductor device has decreased. In the semiconductor devices, an element isolating film having an STI (Shallow Trench Isolation) structure has been used as a structure that isolates individual elements from each other. The STI is formed by providing a trench (hereinafter, referred to as an "STI trench") using a silicon nitride film pattern as a mask and embedding an insulating film, such as a silicon oxide film, in the STI trench, in a semiconductor substrate.

The insulating film is formed using a chemical vapor deposition (CVD) method. However, before depositing the insulating film using the CVD method, a bottom surface of the STI trench is thermally oxidized and a thin silicon oxide film is formed on the surface of the STI trench.

Since a size of a semiconductor device decreases, a ratio (aspect ratio) of a depth of the STI trench to an opening width increases. If the aspect ratio increases, an embedding property of the insulating film is deteriorated. As a result, an upper end of the STI trench may be embedded by the insulating film before the entire STI trench is embedded by the insulating film, which results in forming a void in the STI trench.

An example of a method that improves deterioration of a embedding property due to a decrease in the size is disclosed in U.S. Pat. No. 6,271,143. According to a technique that is described in U.S. Pat. No. 6,271,143, a method that expands (pull-back) an opening of an insulating film used as a mask at the time of forming the STI trench is used, and an upper end of the opening is suppressed from being clogged by increasing a width of the opening by etching In this way, a void can be suppressed from being formed in the STI trench.

Further, Japanese Laid-open patent publication NO. 8-288382 discloses a method in which an organic film that is composed of an organic polymer is formed on side surfaces and a bottom surface of the STI trench, and the organic film of the bottom surface is removed. According to this method, anisotropy can be maintained at a film deposition speed of the insulating film.

Furthermore, according to a technique that is disclosed in Japanese Laid-open patent publication NO. 2004-207280, an embedding property of an STI trench is not improved but adhesion of an insulating film that embeds the STI trench is improved. Accordingly, contaminated materials or residual materials that are attached to a surface where the insulating film is formed can be removed by a sputtering effect of ions that are present in plasma.

However, if the techniques that are disclosed in U.S. Pat. No. 6,271,143, Japanese Laid-open patent publication NO. 8-288382, and Japanese Laid-open patent publication NO. 2004-207280 are applied to the method of manufacturing a semiconductor device having a small size, the following problems are generated.

First, according to the technique that is disclosed in U.S. Pat. No. 6,271,143, if a size of a semiconductor element decreases, intervals between the STI trenches are also narrowed. For this reason, an opening width of the STI trench cannot be made to be equal to a width, which is needed to effectively embed the insulating film until the bottom surface of the STI trench. Further, if the opening width of the STI trench excessively increases, a substrate is exposed, and a threshold voltage adjusting ion implantation depth may be different. As a result, transistors that effectively have two kinds of threshold voltages are present in parallel, which results in deteriorating an element characteristic.

Further, according to the technique that is disclosed in Japanese Laid-open patent publication NO. 8-288382, if the size of the semiconductor device decreases, an opening width of the STI trench is also narrowed. As a result, it may be difficult for etching species to reach the bottom portion of the STI trench. For this reason, a removal speed of an organic film that is formed on side surfaces of the STI trench may be faster than a removal speed of an organic film that is formed on a bottom surface of the STI trench, which makes it impossible to remove only the organic film on the bottom surface by etching. In this case, anisotropy cannot be maintained at a film deposition speed of the insulating film, and the insulting film cannot be uniformly embedded on the side surfaces and the bottom surface of the STI trench.

As described above, according to the techniques that are disclosed in U.S. Pat. No. 6,271,143, Japanese Laid-open patent publication NO. 8-288382, and Japanese Laid-open patent publication NO. 2004-207280, it is not possible to embed the insulating film without forming the void in the minute STI trench.

SUMMARY

In one embodiment, there is provided a method of manufacturing a semiconductor device. The method includes a process of forming a shallow trench isolation (STI) trench in a substrate; a process of forming a thermal oxide film on a sidewall and a bottom surface of the STI trench; a process of performing a plasma treatment on the thermal oxide film that is located at a bottom portion of the STI trench; and a process of forming an insulating film in the STI trench using a chemical vapor deposition (CVD) method. In the performing of the plasma treatment, an arrival density of active specifies that are generated by plasma is larger at the bottom portion than at the sidewall.

According to the embodiment of the present invention, the plasma treatment is performed on the thermal oxide film that is formed on the bottom surface of the STI trench, thereby processing the thermal oxide film at the bottom surface of the STI trench. If the plasma treatment is performed under the above conditions, it is possible to selectively perform the plasma treatment on the bottom surface of the STI trench. Accordingly, a film deposition speed at the bottom surface of the STI trench can be increased more than a film deposition speed at the side surfaces of the STI trench. In addition, it is possible to deposit the insulating film from the bottom surface of the STI trench using a film deposition speed difference between the side surfaces and the bottom surface of the STI trench. Accordingly, even in the minute STI trench, it is possible to embed the insulating film without forming the void.

According to the embodiment of the present invention described above, it is possible to bury the insulating film without forming the void even in the minute STI trench.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1A:
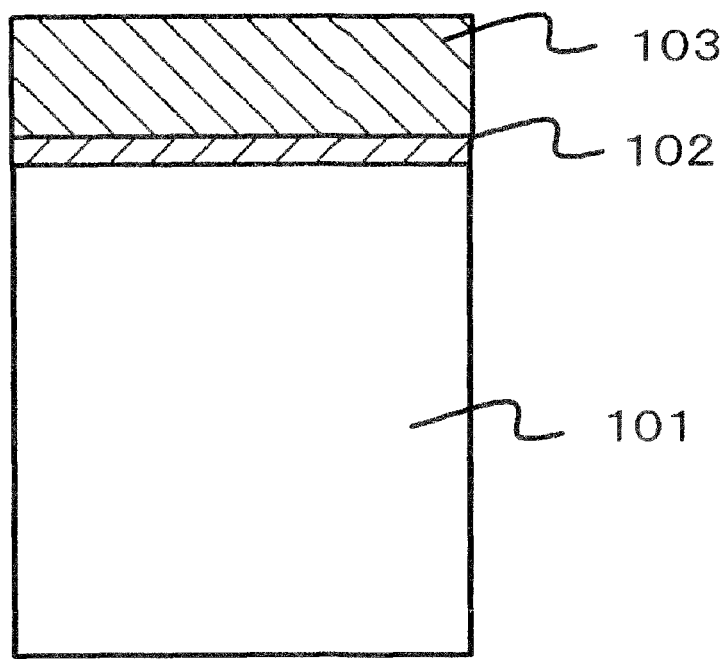
FIGS. 1A and 1B show a method of manufacturing a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, the preferred embodiment of the present invention will be described in detail with reference to the accompanying drawings. In all drawings, structural elements that have substantially the same function and structure will be denoted by the same reference numerals, and the description of these structural elements will not be repeated.

FIGS. 1A to 3B show a method of manufacturing a semiconductor device according to this embodiment. The method of manufacturing a semiconductor device according to this embodiment includes a process of forming a shallow trench isolation (STI) trench 110 in a substrate 101, a process of forming a thermal oxide film 104 on a sidewall and a bottom surface of the STI trench 110, a process of performing a plasma treatment on the thermal oxide film 104 that is located at a bottom portion of the STI trench 110, and a process of forming an insulating film 105 in the STI trench 110 using a chemical vapor deposition (CVD) method. In the method of manufacturing a semi conductor device, during the plasma treatment process, the plasma treatment is performed such that an arrival density of active specifies generated by plasma is larger at the bottom portion than at the sidewall.

Hereinafter, the method of manufacturing a semiconductor device according to this embodiment will be described in detail using FIGS. 1A to 3B.

First, as shown in FIG. 1A, a thin oxide film 102 is formed on the substrate 101. When the substrate 101 is composed of a silicon substrate, the oxide film 102 is a thermal silicon oxide film. Next, a silicon nitride film 103 is formed on the oxide film 102.

Figure 1B:
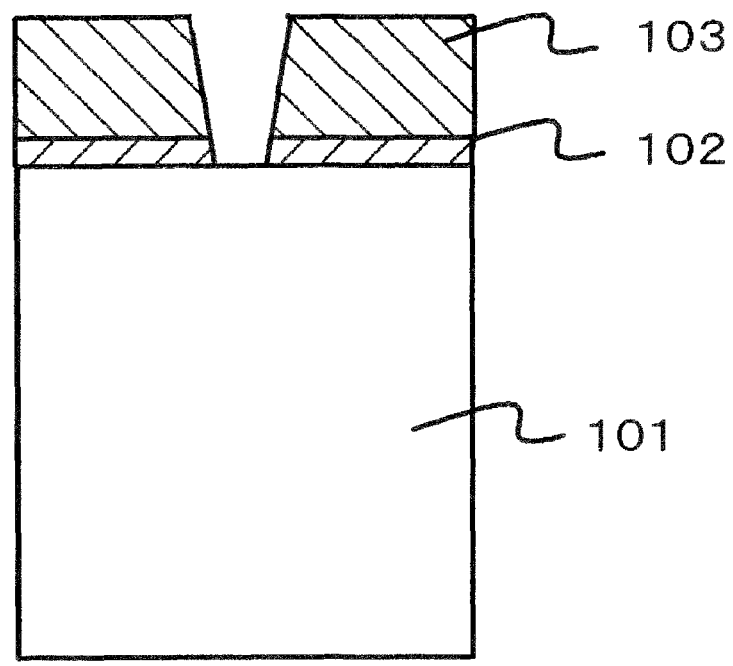

Next, a resist pattern (not shown) is formed on the silicon nitride film 103 using a lithography process. At this time, after forming a hard mask to cover the silicon oxide film 103, the resist pattern may be formed on the hard mask. In addition, an opening is provided in the silicon nitride film 103 and the oxide film 102 using the resist pattern as a mask, as shown in FIG. 1B.

Figure 2A:
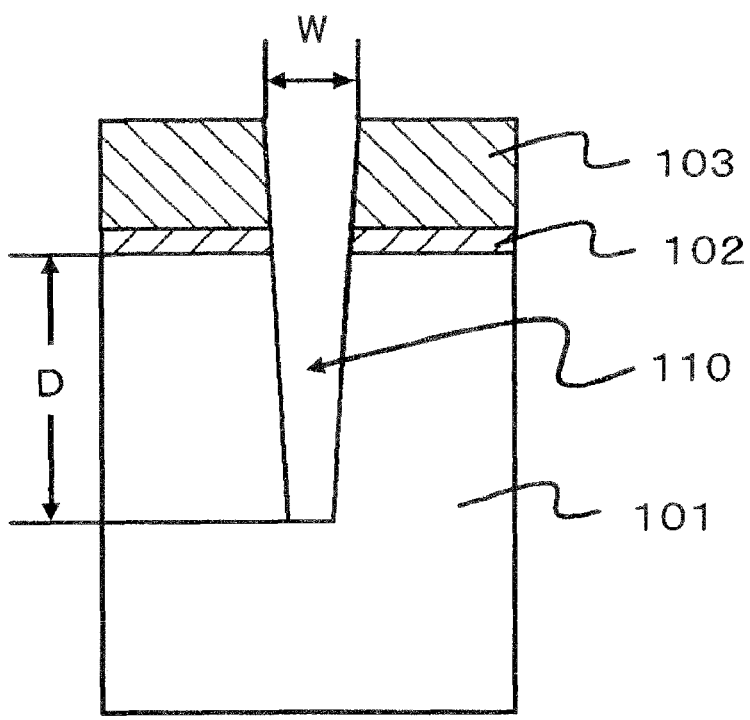
FIGS. 2A and 2B show a method of manufacturing a semiconductor device according to an embodiment of the present invention.
Figure 2B:
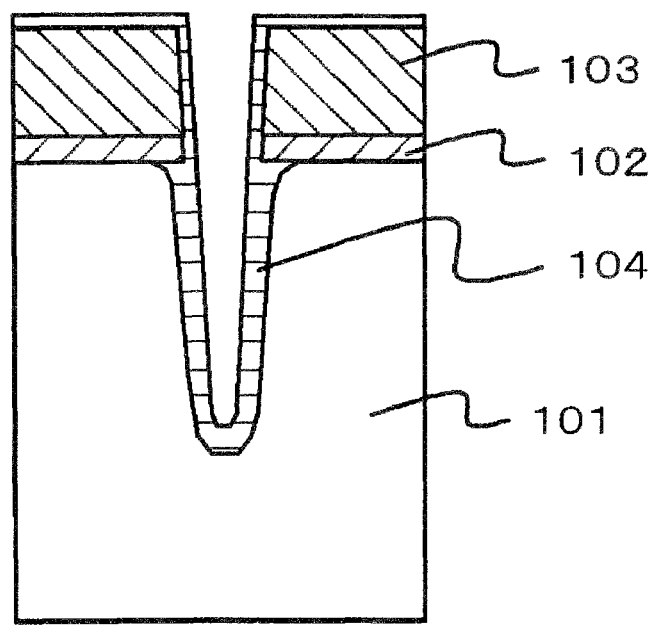

Next, the STI trench 110 is formed in the substrate 101 using the silicon nitride film 103 as the mask, as shown in FIG. 2A. Since the required depth D of the STI trench 110 is determined by an element isolation pressure, even though an opening width is narrow, the STI trench 110 cannot be shallowly formed. Accordingly, when the size of the STI trench decreases, a ratio (D/W) of the depth D of the STI trench 110 with respect to the opening width W increases. In this embodiment, the opening width W of the STI trench 110 may be equal to or less than 100 nm. However, the depth D of the STI trench 110 is equal to or more than 100 nm and equal to or less than 500 nm. Further, the lower limit of the opening width W is not limited to a specific numerical value, but is preferably equal to or more than 30 nm in terms of practicality.

Next, after removing the resist pattern, the sidewall and the bottom surface of the STI trench 110 are thermally oxidized. At this time, under an atmosphere of a mixed gas of oxygen and hydrogen, a thermal oxidation treatment is performed while a pressure and a temperature are appropriately adjusted. As a result, silicon that constitutes the substrate 101 is thermally oxidized, and the thermal oxidation film 104 is formed on the sidewall and the bottom surface of the STI trench 110 (refer to FIG. 2B). Further, it is possible to decrease an interface (defect) density that is generated at an interface between the substrate 101 and the thermal oxide film 104.

Figure 3A:
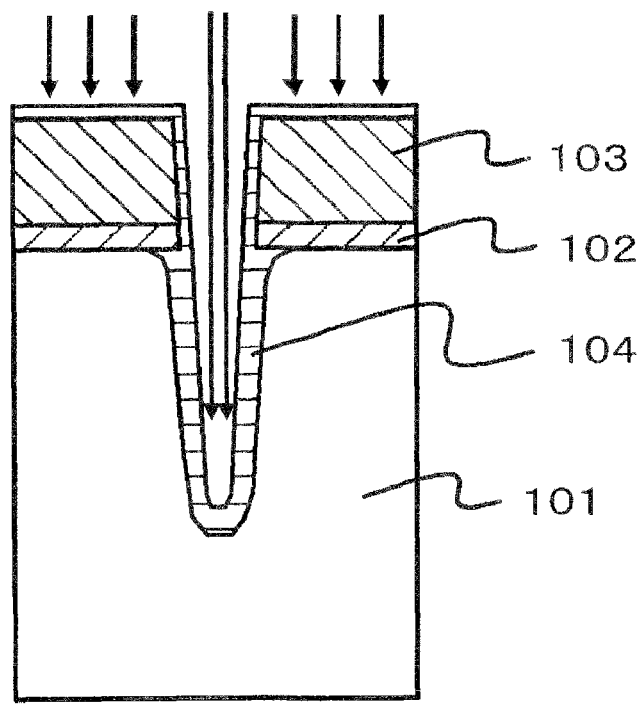
FIGS. 3A and 3B show a method of manufacturing a semiconductor device according to an embodiment of the present invention.

Next, as shown in FIG. 3A, a plasma treatment is performed on the surface of the thermal oxide film 104 that is located at the bottom portion of the STI trench 110. Hereinafter, the conditions of the plasma treatment will be described.

First, as treatment gas, gas that is selected from the group consisting of oxygen, argon, helium, and nitrogen, for example, oxygen gas is used.

Further, in order to excite plasma, power is applied in a range where the plasma is stably generated. Preferably, power equal to or more than $0.1$ W/cm$^2$ and equal to or less than 10 W/cm$^2$ per area of the substrate 101 is applied. In this way, the introduced oxygen gas generates active specifies, such as an oxygen ion (O$^+$) and an oxygen radical (O*), which are needed to perform the plasma treatment, can be effectively formed.

Further, during the plasma treatment, bias power may be applied to the substrate 101. As a result, by attracting ions formed by plasma excitation to the bottom surface of the STI trench 110, a larger amount of ions can be irradiated onto the bottom surface of the STI trench 110 in comparison with the side surfaces. The bias power equal to or more than $0.1$ W/cm$^2$ and equal to or less than $1.0$ W/cm$^2$ per area of the substrate 101 may be applied. If the applied bias power is excessively small, during a process of forming the insulating film 105 that will be described in detail below, a film deposition speed of the bottom surface cannot be sufficiently increased Meanwhile, if the applied bias power is excessively large, it is riot preferable, because the surface of the thermal oxide film 104 may be sputtered and the thermal oxide film 104 may be removed. The bias power that is equal to or more than 100 W and equal to or less than 600 W may be applied to the substrate 101 having an area of 700 cm$^2$.

Further, the plasma treatment may be performed under a pressure that is equal to or higher than 40 Pa and equal to or lower than 134 Pa (equal to or higher than 0.3 Torr and equal to or lower than 1 Torr). If the pressure is excessively low, it is not preferable, because the treatment time is lengthened. If the pressure is excessively high, it is not preferable, because it is difficult to perform a control operation.

Figure 3B:
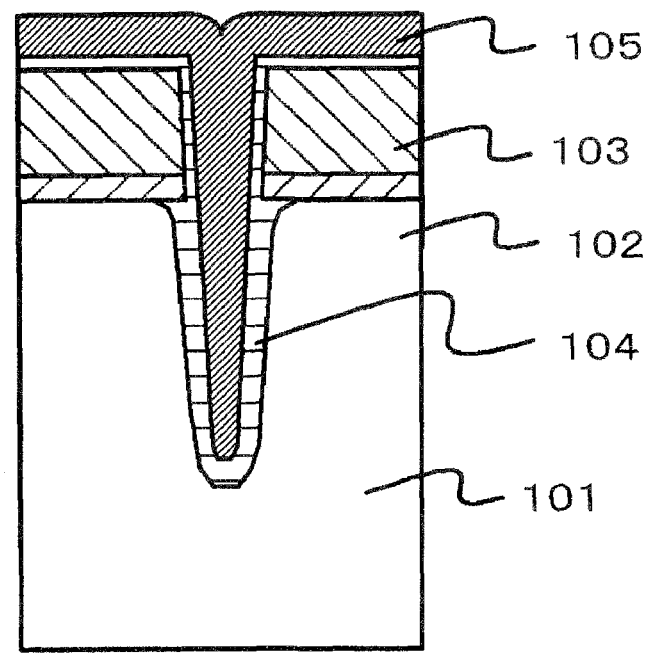

After performing the plasma treatment under the above conditions, as shown in FIG. 3B, the insulating film 105 is formed using the CVD method. The insulating film 105 is assumed as a silicon oxide film. In this embodiment, it is preferable to use a sub-atmospheric CVD (SACVD) method using ozone and tetraethoxysilane (TEOS). In this way, it is possible to vary a growth rate of the insulating film 105 in accordance with a base.

That is, by using the thermal oxide film 104 subjected to the plasma treatment as the base, a film deposition speed at the bottom surface of the STI trench 110 is improved as compared with that at the side surfaces of the STI trench 110.

Further, in the opening of the STI trench 110, since the oxide film 102 is used as the base, a film deposition speed is lowered as compared with the case where the thermal oxide film 104 is used as the base. Accordingly, it is possible to deposit the insulating film 105 from the bottom surface of the STI trench 110.

Next, the functions and effects of this embodiment will be described. According to the method according to this embodiment, the plasma treatment is performed on the thermal oxide film 104 that is formed on the bottom surface of the STI trench 110, thereby processing the thermal oxide film 104 at the bottom surface of the STI trench 110. If the plasma treatment is performed under the above conditions, it is possible to selectively perform the plasma treatment on the bottom surface of the STI trench 110, and an arrival density of active specifies that are generated by plasma can be made to be large at the bottom portion of the STI trench 110 rather than the sidewall of the STI trench 110. Accordingly, a film deposition speed at the bottom surface of the STI trench 110 can be faster than a film deposition speed at the side surfaces of the STI trench 110 by deforming the bottom surface of the STI trench 110 more than the side surfaces of the STI trench 110. In addition, it is possible to deposit the insulating film 105 from the bottom surface of the STI trench 110 using a film deposition speed difference between the side surfaces and the bottom surface of the STI trench 110. Accordingly, even in the minute STI trench 110, it is possible to embed the insulating film 105 without forming the void.

The embodiment of the present invention has been described with reference to the accompanying drawings, but the present invention is not limited thereto. Various configurations other than the above configuration may be used.

It is apparent that the present invention is not limited to the above embodiment, and may be modified and changed without departing from the scope and spirit of the invention.

What is claimed is:

1. A method of manufacturing a semiconductor device, comprising:
    forming a shallow trench isolation (STI) trench in a substrate;
    forming a thermal oxide film on a sidewall and a bottom surface of the STI trench;
    performing a plasma treatment confined to the thermal oxide film that is located at a bottom portion of the STI trench; and
    forming an insulating film in the STI trench using a chemical vapor deposition (CVD) method,
    wherein, in the performing of the plasma treatment, an arrival density of active specifies that are generated by plasma is larger at the bottom portion than at the sidewall.

2. The method according to claim 1, wherein, during the plasma treatment, power equal to or more than 0.1 $W/cm^2$ and equal to or less than 10 $W/cm^2$ per area of the substrate is applied to excite the plasma.

3. The method according to claim 1, wherein, during the plasma treatment, bias power is applied to the substrate.

4. The method according to claim 3, wherein the bias power equal to or more than 0.1 $W/cm^2$ and equal to or less than 1.0 $W/cm^2$ per area of the substrate is applied.

5. The method according to claim 3, wherein, during the plasma treatment, a larger amount of ions are irradiated on the bottom portion of the STI trench in comparison to the sidewall.

6. The method according to claim 1, wherein, during the plasma treatment, gas that is selected from the group consisting of oxygen, argon, helium, and nitrogen is used as treatment gas.

7. The method according to claim 1, wherein the plasma treatment is performed under a pressure that is equal to or higher than 40 Pa and equal to or lower than 134 Pa.

8. The method according to claim 1, wherein the insulating film is formed using the CVD method using tetraethoxysilane.

9. The method according to claim 1, wherein an opening width of the STI trench is equal to or less than 100 nm.

10. The method according to claim 1, wherein, during the forming of the thermal oxide film, the growth rate of the thermal oxide film is varied.

11. The method according to claim 1, wherein a deposition speed of the insulating film at the bottom of the STI trench is different from the sidewall.

12. The method according to claim 11, wherein the deposition speed of the insulating film at the bottom of the STI trench is faster than the sidewall.

13. The method according to claim 11, wherein the forming of the insulating film excludes formation of a void.

* * * * *